United States Patent
Brandstätter et al.

(10) Patent No.: US 8,714,611 B2
(45) Date of Patent: May 6, 2014

(54) HANDLING DEVICE FOR HANDLING OF A WAFER

(75) Inventors: Ingo Brandstätter, Kopfing im Innkreis (AT); Thomas Wagenleitner, Aurolzmünster (AT); Martin Schmidbauer, Enzenkirchen (AT)

(73) Assignee: EV Group GmbH, St. Florian am Inn (AT)

( * ) Notice: Subject to any disclaimer, the term of this patent is extended or adjusted under 35 U.S.C. 154(b) by 0 days.

(21) Appl. No.: 13/811,320

(22) PCT Filed: Jul. 23, 2010

(86) PCT No.: PCT/EP2010/004528
§ 371 (c)(1),
(2), (4) Date: Jan. 21, 2013

(87) PCT Pub. No.: WO2012/010186
PCT Pub. Date: Jan. 26, 2012

(65) Prior Publication Data
US 2013/0119688 A1   May 16, 2013

(51) Int. Cl.
*B65G 49/07*   (2006.01)

(52) U.S. Cl.
USPC .............. 294/212; 294/213; 414/941

(58) Field of Classification Search
USPC .............. 294/212, 213, 183, 185; 414/941; 269/21
See application file for complete search history.

(56) References Cited

U.S. PATENT DOCUMENTS

| | | | |
|---|---|---|---|
| 4,667,944 A | 5/1987 | Althouse | 269/21 |
| 4,778,326 A * | 10/1988 | Althouse et al. | 414/800 |
| 4,904,012 A * | 2/1990 | Nishiguchi et al. | 294/188 |
| 5,192,070 A * | 3/1993 | Nagai et al. | 271/90 |
| 5,423,716 A * | 6/1995 | Strasbaugh | 451/388 |
| 6,541,989 B1 * | 4/2003 | Norris et al. | 324/754.03 |
| 7,909,374 B2 * | 3/2011 | Thallner | 294/212 |
| 2007/0026772 A1 | 2/2007 | Dolechek et al. | 451/388 |

FOREIGN PATENT DOCUMENTS

WO   WO 02/29856   4/2002   ................ H01L 2/00

OTHER PUBLICATIONS

International Search Report for International Application No. PCT/EP2010/004528, Sep. 29, 2010.

* cited by examiner

*Primary Examiner* — Dean Kramer
(74) *Attorney, Agent, or Firm* — Kusner & Jaffe

(57) ABSTRACT

Handling device for handling of a wafer in the processing of the wafer with the following features: a carrier with a flat receiving side for holding the wafer, an especially lattice-like grid structure which is raised on the receiving side relative to the receiving side, a flexible cover which covers the grid structure relative to the carrier, sealing it, for fixing of the wafer on the carrier, and a grid space which is bordered by the cover and the carrier can be exposed to negative pressure, characterized in that the grid structure and the cover with the receiving side form an especially trough-shaped receiving space for holding of receiving structures which are provided on the wafer and which are raised relative to the wafer receiving side.

6 Claims, 2 Drawing Sheets

HANDLING DEVICE FOR HANDLING OF A WAFER

FIELD OF THE INVENTION

This invention relates to a handling device for handling of a wafer in the processing of a wafer.

BACKGROUND OF THE INVENTION

There are various devices for handling of wafers and as a result of wafers which are becoming thinner and thinner as well as of the simultaneously increasing diameters of wafers of up to 450 mm, handling devices for wafers are becoming more and more important, especially when the wafers are provided with expensive structures.

For fixing of wafers, mechanical methods are known in which the mechanical stress on the wafer, especially at the pressure point of mechanical clamps, also constitutes a major technical problem at the same time.

Fixing of wafers by means of chemical methods such as cementing or by adhesion leads to often very strong adhesion between the sample holder or carrier wafer and the wafer. The connections which have been produced in this way in general must be chemically dissolved; this is an environmentally harmful and tedious process.

The fixing of wafers by means of electrostatic charging leads to partially unwanted discharging of the carrier and/or of the wafer.

U.S. Pat. No. 4,667,944 discloses a handling device for semiconductor chips 12 in which a textile fabric 16 on a carrier 10 is covered by a flexible cover 18 to which a chip 12 can adhere. The adhesion force can be reduced by applying a vacuum on the contact surface between the flexible film 18.

SUMMARY OF THE INVENTION

The object of this invention is to devise a handling device for handling of wafers with which reliable and simple handling of a wafer is enabled in a manner as gentle and non-destructive as possible. Moreover the technical object shall be achieved that the wafer is detached from the handling device without residue, without damaging the wafer, and without major expenditure of force.

This object is achieved with the features of the claims. Advantageous developments of the invention are given in the dependent claims. All combinations of at least two of the features given in the specification, the claims and/or the figures also fall within the framework of the invention. At the given value ranges, values within the indicated limits will also be considered disclosed as boundary values and will be claimed in any combination.

The invention is based on the idea of providing a spacer which only partially supports the wafer on the handling device; the spacer is formed by means of a cover, especially a cover film and by applying a negative pressure relative to the environment such that the contact surface of the cover film with the wafer can be reduced. This reduces the adhesion force so that the wafer can be easily removed from the cover nondestructively and without residue. At the same time, handling is especially environmentally safe solely by changing the pressure and thus at the same time is especially energy-efficient.

The carrier as claimed in the invention makes it possible to fix ultrathin wafers, especially wafers with components on the surface, in regions without components on the surface so that the especially sensitive and expensive parts of the wafer are protected and fixing of the wafer, especially on the edge, is possible in regions which may even be especially intended for this purpose. In this way, the wafer can be removed from the carrier or the adhesive cover without residue, without damage and with extremely low expenditure of force. It is especially advantageous that the handling device can be re-used, especially for more than 10, preferably more than 100, especially preferably more than 1000 handling processes.

According to one advantageous embodiment of the invention, it is provided that the grid structure is made annular, especially in the shape of a circular ring, preferably with a ratio of the ring width B to the diameter D of the grid structure of less than 1:5, especially less than 1:10, preferably less than 1:15. In this way, uniform fixing and especially simple detachment of the wafer from the annular cover of the grid structure are enabled.

To the extent the cover is an especially adhesive film, preferably a gel film, handling, especially the detachment of the wafer, takes place easily without chemical solvents or temperature effect so that in this way resources are saved. PDMS (polydimethyl siloxane) or PFPE (perfluoropolyether) are especially suitable as material for the film.

According to another advantageous embodiment of the invention, it is provided that fixing takes place solely in a region of the wafer without raised structures, especially on the edge of the wafer. In this way the raised structures of the wafer are protected and stress-free holding of the wafer is enabled.

A use of the handling device within wafer processing devices which process wafers at negative pressure can be regarded as an independent invention. Here it is especially advantageous if the grid space can be exposed to a higher negative pressure than the negative pressure in the wafer processing device.

Other advantages, features and details of the invention will become apparent from the following description of preferred exemplary embodiments and using the drawings.

DETAILED DESCRIPTION OF THE PREFERRED EMBODIMENTS

In the figures the same components and components with the same function are identified with the same reference numbers.

Figure 1:
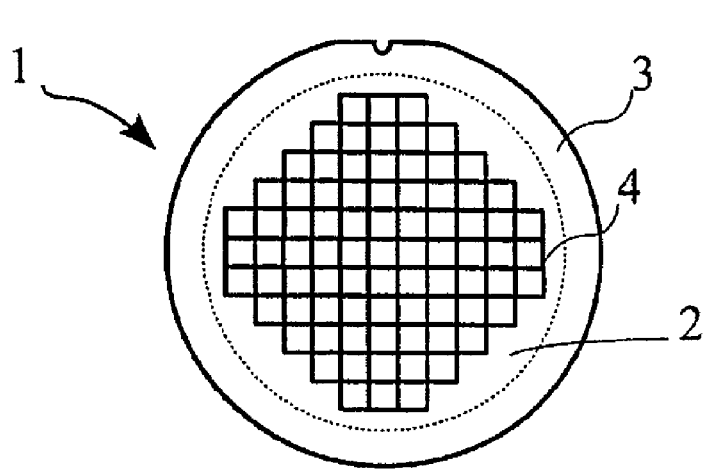
FIG. 1 shows a schematic plan view of an assembled wafer.
Figure 2A:
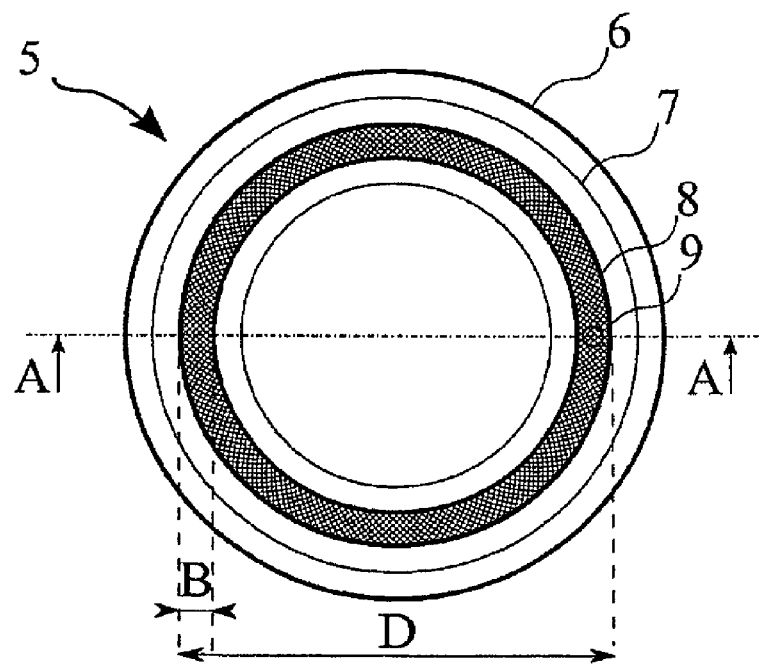
FIG. 2a shows a schematic plan view of a handling device as claimed in the invention.

FIG. 1 shows a wafer 1 with a region of the wafer 1 with raised structures 4, especially chips, and a region of the wafer 1 without raised structures, specifically an edge region 3 of the wafer 1 which is used for fixing of the wafer 1 on a handling device 5 which is shown in FIG. 2a. The raised structures 4 are on one wafer receiving side 2 which enters into contact on a handling device 5 with the edge region 3 on one contact surface 14.

Figure 2B:
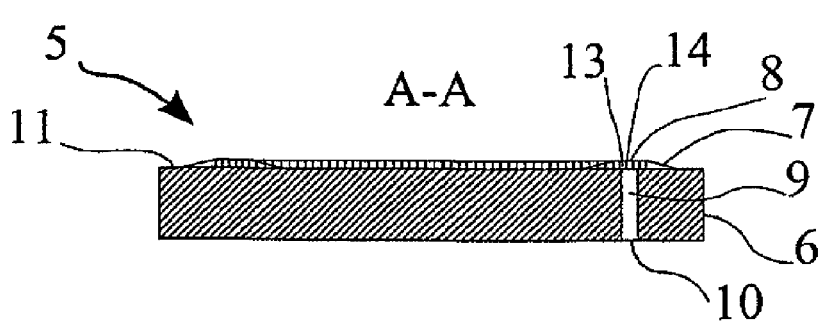
FIG. 2b shows a schematic side view according to cutting line A-A from FIG. 2a, FIG. 3a shows an enlarged, schematic sectional view of the grid structure as claimed in the invention in a fixing position.

The handling device 5 consists of a carrier 6, here a chuck, on which a grid structure 8 is applied, especially on one flat receiving side 11 which is up in the alignment shown in FIG. 2b.

According to FIG. 2a the grid structure 8 is circularly ring-shaped and projects from the receiving side 11 of the carrier 6. The grid structure 8 is connected to the carrier 6, either inlet, welded in, or cemented on. The grid structure 8 does not have a closed surface and is covered with a cover 7 made as a gel film and the cover 7 is thus likewise annular and in the embodiment shown here is fixed and tightly sealed laterally from the grid structure 8 on the carrier 6, here on the receiving side 11. It is also conceivable for the film to cover the entire receiving side 11 and to be fixed on the carrier 6 laterally or underneath. In this way the film becomes more stable, in the illustrated embodiment the annular film is however subject to lower deformations by continuous stretching.

The wafer 1 is placed centered on the handling device 5 for handling by the handling device 5 so that the edge region 3 comes into contact with the grid structure 8 and the raised structures 4 on the wafer 1 are held in the trough-shaped receiving space 12 which is formed by the grid structure 8, the cover 7 and the receiving side 11, and are protected there. Thus this invention at the same time achieves several objects, specifically careful handling of the wafer 1 and at the same time simple detachment of the wafer 1.

The wafer 1 adheres to the cover 7 by the adhesive action of the cover 7. In one fixing position of the cover 7 shown in FIG. 3a the adhesion force is greatest, especially over the entire surface between the contact surface 14 of the cover 7 and the corresponding contact region in the edge region 3 of the wafer 1.

In the fixing position the cover 7 due to its flexibility is clamped along the top of the grid structure 8 and is essentially flat.

A grid space 13 bordered by the cover 7, by the grid structure 8 and by the flat receiving side 11 can be exposed to negative pressure by means of a vacuum device 10 which is connected to a vacuum line 9, the negative pressure being distributed uniformly along the annular grid structure 8 as a result of the texture of the grid structure 8. The grid structure 8 in one advantageous embodiment is lattice-like, but can also be formed from individual structure components, especially balls.

Figure 3A:
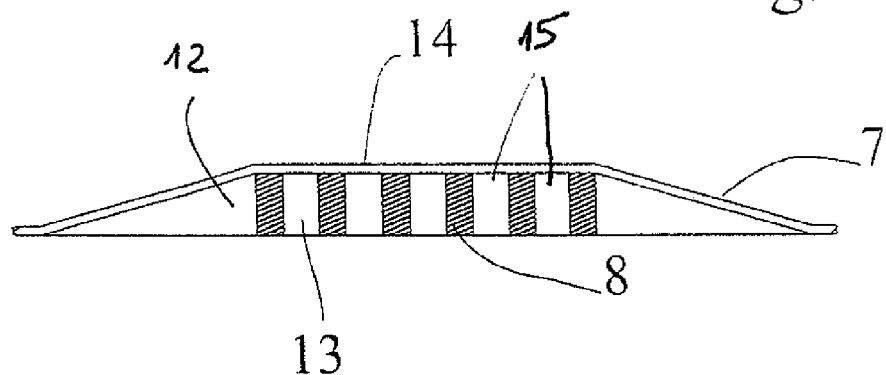
FIG. 3b shows an enlarged, schematic sectional view of the grid structure as claimed in the invention in a release position.
Figure 3B:
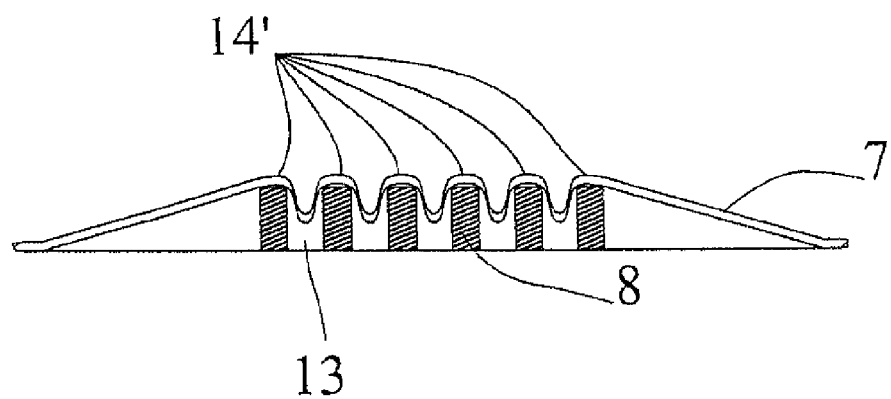

By applying a negative pressure in the grid space 13 the cover 7 deforms on its contact surface 14 on the top of the grid structure 8 by the flexible cover 7 on free regions 15 of the grid structure 8 being drawn into the grid space 13 so that in its release position shown in FIG. 3b only the regions of the cover 7 which are supported by the grid structure 8 on the correspondingly smaller contact surface 14' are in contact with the wafer 1. The contact surface 14' is greatly diminished compared to the contact surface 14, as a result of which at the same time the adhesion force of the cover 7 decreases relative to the wafer 1 in the edge region 3 and the wafer 1 can thus be easily detached from the handling device 5.

The ratio between the area of the contact surface 14 in the fixing position shown in FIG. 3a and the area of the contact surface 14' in the release position shown in FIG. 3b is greater than 1.5:1, especially 2:1, preferably 3:1.

DESCRIPTION OF THE REFERENCE NUMERALS

1 Wafer
2 Wafer Receiving Side
3 Edge Region
4 Raised Structures
5 Handling Device
6 Carrier
7 Cover
8 Grid Structure
9 Line
10 Vacuum Device
11 Flat Receiving Side
12 Receiving Space
13 Grid Space
14, 14' Contact Surface
15 Free Regions
B Ring Width
D Diameter Having described the invention, the following is claimed:

1. Handling device for handling of a wafer in the processing of the wafer, the device comprising:
    a carrier having a receiving side for holding the wafer, the receiving side including a flat central portion,
    a grid structure disposed on the receiving side of the carrier around an outer periphery of the flat central portion of the receiving side, the grid structure having an upper surface raised above the flat central portion of the receiving side of the carrier, and
    a flexible cover for fixing the wafer on the carrier, the cover disposed over the grid structure and covering the upper surface of the grid structure such that the flexible cover, the grid structure and the carrier define a grid space, the grid space being fluidly connected to a source of negative pressure for detaching the wafer from the carrier,
wherein
    the grid structure and the flat central portion of the receiving side of the carrier define a trough-shaped receiving space dimensioned for receiving structures which are disposed on the wafer and which are raised relative to a wafer receiving side of the wafer such that the structures on the wafer are fluidly isolated from a surrounding environment when the wafer is attached to the receiving side of the carrier.

2. Handling device as claimed in claim 1, wherein the grid structure is made annular in the shape of a circular ring with a ratio of a ring width B to a diameter D of the grid structure of less than 1:5.

3. Handling device as claimed in claim 1, wherein the cover is an adhesive film.

4. Handling device as claimed in claim 1, wherein fixing of the wafer on the carrier takes place solely in a region of the wafer without raised structures.

5. Handling device as claimed in claim 1, wherein the cover is a gel film.

6. Handling device as claimed in claim 1, wherein fixing of the carrier on the wafer takes place solely on the edge of the wafer.

\* \* \* \* \*